(12) United States Patent
Samir et al.

(10) Patent No.: US 9,123,765 B2
(45) Date of Patent: Sep. 1, 2015

(54) SUSCEPTOR SUPPORT SHAFT FOR IMPROVED WAFER TEMPERATURE UNIFORMITY AND PROCESS REPEATABILITY

(71) Applicant: Applied Materials, Inc., Santa Clara, CA (US)

(72) Inventors: Mehmet Tugrul Samir, Mountain View, CA (US); Shu-Kwan Lau, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/182,634

(22) Filed: Feb. 18, 2014

(65) Prior Publication Data

US 2014/0251208 A1    Sep. 11, 2014

Related U.S. Application Data

(60) Provisional application No. 61/776,318, filed on Mar. 11, 2013.

(51) Int. Cl.
*B05C 13/00* (2006.01)
*H01L 21/687* (2006.01)
*B05C 11/08* (2006.01)

(52) U.S. Cl.
CPC .......... *H01L 21/68792* (2013.01); *B05C 11/08* (2013.01)

(58) Field of Classification Search
None
See application file for complete search history.

(56) References Cited

U.S. PATENT DOCUMENTS

| | | | | |
|---|---|---|---|---|
| 5,318,634 | A * | 6/1994 | deBoer et al. | 118/730 |
| 6,301,434 | B1 | 10/2001 | McDiarmid et al. | |
| 6,893,507 | B2 | 5/2005 | Goodman et al. | |
| 8,591,700 | B2 | 11/2013 | Gatchalian et al. | |
| 2011/0121503 | A1* | 5/2011 | Burrows et al. | 269/289 R |

* cited by examiner

*Primary Examiner* — Joseph Miller, Jr.
(74) *Attorney, Agent, or Firm* — Patterson & Sheridan, LLP

(57) ABSTRACT

Embodiments of the invention generally relate to susceptor support shafts and process chambers containing the same. A susceptor support shaft supports a susceptor thereon, which in turn, supports a substrate during processing. The susceptor support shaft reduces variations in temperature measurement of the susceptor and/or substrate by providing a consistent path for a pyrometer focal beam directed towards the susceptor and/or substrate, even when the susceptor support shaft is rotated. The susceptor support shafts also have a relatively low thermal mass which increases the ramp up and ramp down rates of a process chamber.

20 Claims, 3 Drawing Sheets

SUSCEPTOR SUPPORT SHAFT FOR IMPROVED WAFER TEMPERATURE UNIFORMITY AND PROCESS REPEATABILITY

CROSS-REFERENCE TO RELATED APPLICATIONS

This application claims benefit of U.S. Provisional Patent Application Ser. No. 61/776,318, filed Mar. 11, 2013, which is herein incorporated by reference.

BACKGROUND OF THE INVENTION

1. Field of the Invention

Embodiments of the present invention generally relate to supporting substrates in processing chambers.

2. Description of the Related Art

During processing, substrates are positioned on a susceptor within a process chamber. The susceptor is supported by a susceptor support shaft, which is rotatable about a central axis. The susceptor support shaft includes multiple arms extending therefrom—usually three to six—which support the susceptor. As the susceptor support shaft is rotated during processing, the arms extending from the susceptor support shaft interrupt a pyrometer beam used to measure a temperature of the susceptor or the substrate. Even though the arms may be formed from quartz, which is generally optically transparent, at least some amount of light is absorbed by the arms, and thus, is not completely optically transparent. This amount of light absorbed by the arms affects the amount of light transmitted by the pyrometer beam to the susceptor, and thus, affects the accuracy of the temperature measurement by the pyrometer. As the susceptor support shaft rotates, there are periods when the arm is within the pyrometer beam path, and periods when the arm is adjacent to the pyrometer beam path. Thus, the amount of light from the pyrometer beam reaching the susceptor varies as the susceptor support rotates, resulting in periods of inaccurate temperature measurement.

Therefore, there is a need for an apparatus which allows more accurate temperature measurement.

SUMMARY OF THE INVENTION

Embodiments of the invention generally relate to susceptor support shafts and process chambers containing the same. A susceptor support shaft supports a susceptor thereon, which in turn, supports a substrate during processing. The susceptor support shaft reduces variations in temperature measurement of the susceptor and/or substrate by providing a consistent path for a pyrometer focal beam directed towards the susceptor and/or substrate, even when the susceptor support shaft is rotated. The susceptor support shafts also have a relatively low thermal mass which increases the ramp up and ramp down rates of a process chamber.

In one embodiment, a susceptor support shaft for a process chamber comprises a cylindrical support shaft and a support body coupled the support shaft. The support body comprises a hub, a plurality of tapered bases extending from the hub, at least three support arms extending from some of the tapered bases, and at least three dummy arms extending from some of the tapered bases.

In another embodiment, an optically transparent susceptor support shaft for a process chamber comprises a cylindrical support shaft and a support body coupled the support shaft. The support body comprises a conical hub, a plurality of tapered bases extending from the hub, at least three support arms extending from some of the tapered bases, the at least three support arms spaced at equal intervals from one another, and at least three dummy arms extending from some of the tapered bases, the at least three dummy arms spaced at equal intervals from one another.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the invention generally relate to susceptor support shafts and process chambers containing the same. A susceptor support shaft supports a susceptor thereon, which in turn, supports a substrate during processing. The susceptor support shaft reduces variations in temperature measurement of the susceptor and/or substrate by providing a consistent path for a pyrometer focal beam directed towards the susceptor and/or substrate, even when the susceptor support shaft is rotated. The susceptor support shafts also have a relatively low thermal mass which increases the ramp up and ramp down rates of a process chamber.

Embodiments disclosed herein may be practiced in the Applied CENTURA® RP EPI chamber, available from Applied Materials, Inc. of Santa Clara, Calif. It is contemplated that other chambers available from other manufacturers may also benefit from embodiments disclosed herein.

Figure 1:
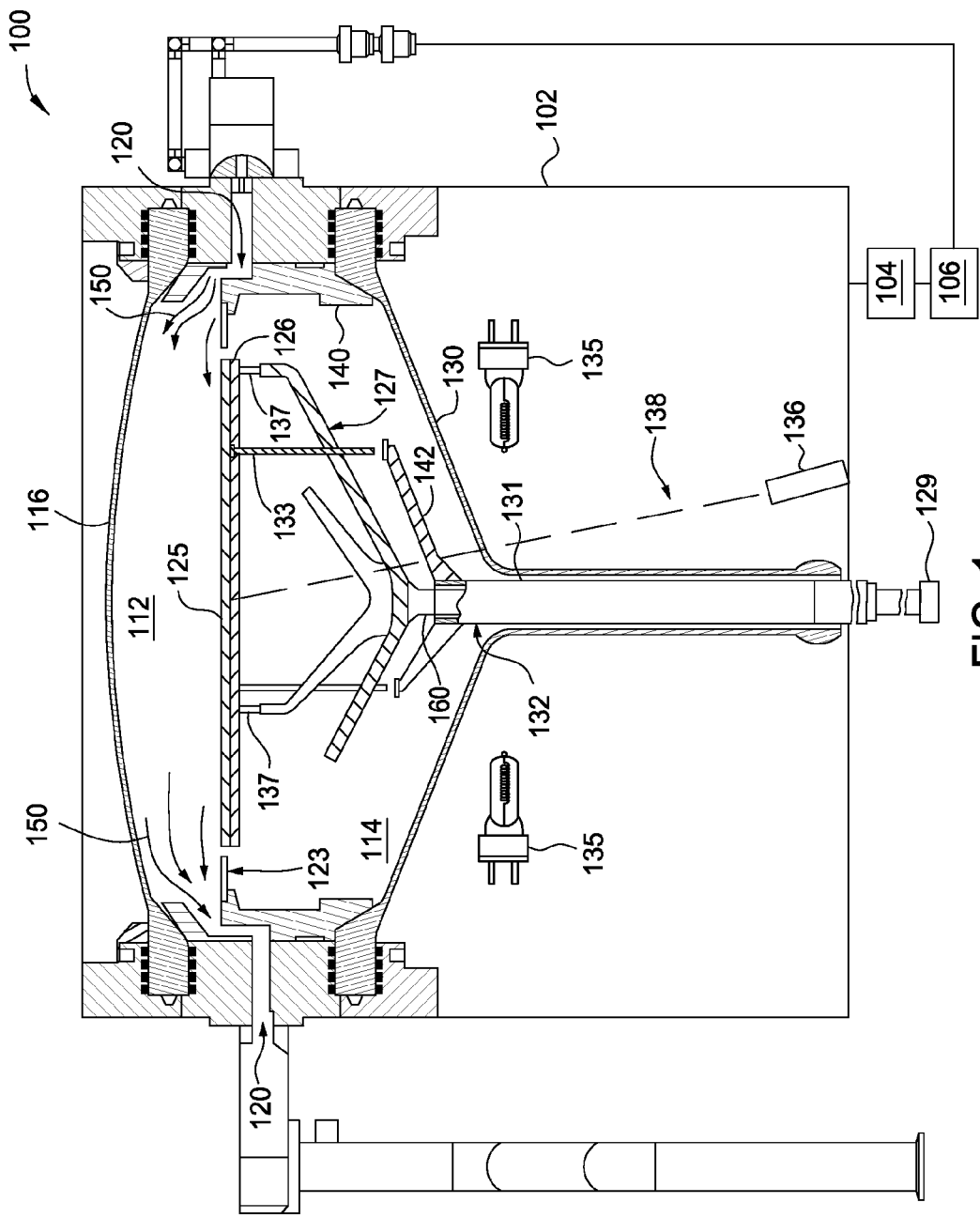
FIG. 1 illustrates a cross sectional view of a processing chamber according to an embodiment of the invention.

FIG. 1 is a cross sectional view of a processing chamber 100 according to an embodiment of the invention. The processing chamber 100 includes a chamber body 102, support systems 104, and a controller 106. The chamber body 102 includes an upper portion 112 and a lower portion 114. The upper portion 112 includes the area within the chamber body 102 between the upper dome 116 and the substrate 125. The lower portion 114 includes the area within the chamber body 102 between a lower dome 130 and the bottom of the substrate 125. Deposition processes generally occur on the upper surface of the substrate 125 within the upper portion 112.

The processing chamber 100 includes a plurality of heat sources, such as lamps 135, which are adapted to provide thermal energy to components positioned within the process chamber 100. For example, the lamps 135 may be adapted to provide thermal energy to the substrate 125, a susceptor 126, and/or the preheat ring 123. The lower dome 130 may be formed from an optically transparent material, such as quartz, to facilitate the passage of thermal radiation therethrough. In one embodiment, it is contemplated that lamps 135 may be positioned to provide thermal energy through the upper dome 116 as well as the lower dome 130.

The chamber body 102 includes a plurality of plenums 120 formed therein. For example, a first plenum 120 may be adapted to provide a process gas 150 therethrough into the upper portion 112 of the chamber body 102, while a second plenum 120 may be adapted to exhaust a process gas 150 from the upper portion 112. In such a manner, the process gas 150 may flow parallel to an upper surface of the substrate 125. Thermal decomposition of the process gas 150 onto the substrate 125 to form an epitaxial layer on the substrate 125 is facilitated by the lamps 135.

A substrate support assembly 132 is positioned in the lower portion 114 of the chamber body 102. The substrate support 132 is illustrated supporting a substrate 125 in a processing position. The substrate support assembly 132 includes a susceptor support shaft 127 formed from an optically transparent material and a susceptor 126 supported by the susceptor support shaft 127. A shaft 160 of the susceptor support shaft 127 is positioned within a shroud 131 to which lift pin contacts 142 are coupled. The susceptor support shaft 127 is rotatable. The shroud 131 is generally fixed in position, and therefore, does not rotate during processing.

Lift pins 133 are disposed through openings 280 (shown in FIG. 2) formed in the susceptor support shaft 127. The lift pins 133 are vertically actuatable and are adapted to contact the underside of the substrate 125 to lift the substrate 125 from a processing position (as shown) to a substrate removal position. The susceptor support shaft 127 is fabricated from quartz, while the susceptor 126 is fabricated from silicon carbide or graphite coated with silicon carbide.

The susceptor support shaft 127 is rotatable in order to facilitate the rotation of the substrate 125 during processing. Rotation of the susceptor support shaft 127 is facilitated by an actuator 129 coupled to the susceptor support shaft 127. Support pins 137 couple the susceptor support shaft 127 to the susceptor 126. In the embodiment FIG. 1, three support pins 137 (two are shown) spaced 120 degrees apart are utilized to couple the susceptor support shaft 127 to the susceptor 126.

A pyrometer 136 is adapted to measure a temperature of the susceptor 126 and/or the substrate 125. A focal beam 138 of the pyrometer is directed through the lower dome 130 and through the susceptor support shaft 127. The pyrometer 136 measures the temperature of the susceptor 126 (for example, when the susceptor 126 is formed from silicon carbide) or the temperature of the substrate 125 (for example, when the susceptor 126 is formed from quartz or when a susceptor is absent and the substrate 125 is supported in another manner, such as by a ring). It is to be noted that lift pin contacts 142 are generally positioned adjacent to the focal beam 138, and do not rotate, and thus, do not interfere with the pyrometer focal beam 138 during processing.

The preheat ring 123 is removably disposed on a lower liner 140 that is coupled to the chamber body 102. The preheat ring 123 is disposed around the internal volume of the chamber body 102 and circumscribes the substrate 125 while the substrate 125 is in a processing position. During processing, the preheat ring 123 is heated by the lamps 135. The preheat ring 123 facilitates preheating of a process gas as the process gas enters the chamber body 102 through a plenum 120 adjacent to the preheat ring 123.

The support system 104 includes components used to execute and monitor pre-determined processes, such as the growth of epitaxial films in the processing chamber 100. The support system 104 includes one or more of gas panels, gas distribution conduits, vacuum and exhaust sub-systems, power supplies, and process control instruments. A controller 106 is coupled to the support system 104 and is adapted to control the processing chamber 100 and support system 104. The controller 106 includes a central processing unit (CPU), a memory, and support circuits. Instructions resident in controller 106 may be executed to control the operation of the processing chamber 100. Processing chamber 100 is adapted to perform one or more film formation or deposition processes therein. For example, a silicon carbide epitaxial growth process may be performed within processing chamber 100. It is contemplated that other processes may be performed within processing chamber 100.

Figure 2:
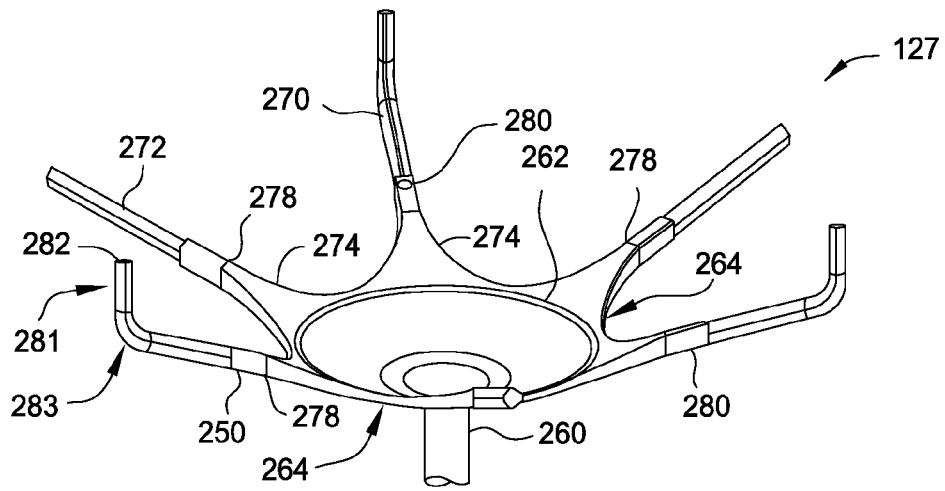
FIG. 2 illustrates a perspective view of a susceptor support shaft, according to an embodiment of the invention.

FIG. 2 illustrates a perspective view of the susceptor support shaft 127. The susceptor support shaft 127 includes a shaft 260 having a cylindrical shape and coupled to a support body 264. The shaft 260 can be bolted, threaded, or connected in another manner to the support body 264. The support body 264 includes a hub 262, for example having a conical shape, and a plurality of tapered bases 274 extending therefrom. At least three support arms 270 extend from some of the tapered bases 274, and at least three dummy arms 272 extending from some of the tapered bases 274. The tapered bases 274 facilitate connection of the support arms 270 and dummy arms 272 to the hub 262.

The support arms 270 include an opening 280 therethrough adjacent to a connecting surface 278 that connects to one of the tapered bases 274. The opening allows the passage of a lift pin therethrough. A distal end 281 of a support arm 270 also includes an opening 282 therein for accepting a pin 137 (shown in FIG. 1). The openings 280 and 282 are generally parallel to one another, and also, are generally parallel to the shaft 260. Each support arm 270 includes an elbow 283 for orienting the opening 282 to accept the pin 137 (shown in FIG. 1). In one embodiment, the elbow 283 forms an obtuse angle. The support arms 270 are spaced at even intervals about the hub 262. In the embodiment shown in FIG. 2, the support arms 270 are spaced about 120 degrees form one another.

The support body 264 also includes a plurality of dummy arms 272. Each dummy arm is coupled to a tapered base 274 and extends linearly therefrom. The dummy arms 272 are spaced at equal intervals from one another, for example, about 120 degrees. In the embodiment shown in FIG. 2, the dummy arms 272 are located about 60 degrees from each of the support arms 270 and alternate therewith around the hub 262. The dummy arms 272 generally do not contact or otherwise support a susceptor. The dummy arms facilitate accurate temperature control of a substrate during processing.

During processing, the susceptor support shaft 127 absorbs thermal energy from lamps utilized to heat a susceptor and/or substrate. The absorbed heat radiates from the susceptor support shaft 127. The radiated heat radiated by the susceptor support shaft 127, particularly the support arms 270, is absorbed by the susceptor and/or substrate. Because of the relatively close position of the support arms 270 to the susceptor or substrate, heat is easily radiated to the susceptor or support shaft causing areas of increased temperature adjacent to the support arms 270. However, utilization of the dummy arms 272 facilitates a more uniform radiation of heat from the susceptor support shaft 270 to the susceptor and/or substrate, and thus, the occurrence of hot spots is reduced. For example, the utilization of dummy arms 272 results in a uniform radiation of a susceptor, rather than three local hot spots adjacent the support arms 270.

Additionally, the absence of a supporting ring adjacent to a susceptor, as is used in some prior approaches, increases thermal uniformity across a substrate. The susceptor support shaft 127 does not include an annular ring coupling the terminal ends of the susceptor support shaft, thus improving thermal uniformity. The utilization of such a ring can result in an increased temperature gradient adjacent to the ring (e.g., near the perimeter of the susceptor). Moreover, the absence of material from between the support arms 270 and the dummy arms 272 reduces the mass of the susceptor support shaft 127. The reduced mass thus facilitates rotation of the susceptor support shaft 127, and also reduces the amount of undesirable thermal radiation from the susceptor support shaft 127 to a susceptor (e.g., due to a reduction in thermal mass). The reduced mass of the susceptor support shaft 127 also assists in achieving faster ramp up and cool down on substrate. The faster ramp up and cool down facilitates increased throughput and productivity.

FIG. 2 illustrates one embodiment; however, additional embodiments are also contemplated. In another embodiment, it is contemplated that the hub 262, the support arms 272, and the dummy arms 272 may be formed form a unified piece of material, such as quartz, rather than individual components. In another embodiment, it is contemplated that the number of support arms 270 may be increased. For example, about, four or six support arms 270 may be utilized. In another embodiment, it is contemplated that the number of dummy arms 272 may be increased or decreased, and may include zero. In another embodiment, the dummy arms 272 may include an elbow and vertically-directed distal end to facilitate further symmetry with the support arms 270, and thus, provide even more uniform heating of the substrate and susceptor. It is to be noted that embodiments which include elbows on the dummy arms 272, or embodiments that include additional dummy arms 272 or support arms 270, may undesirably result in increased thermal mass. In another embodiment, the hub 262 may be semi-spherical or a section of a sphere cut by a plane.

Figure 3:
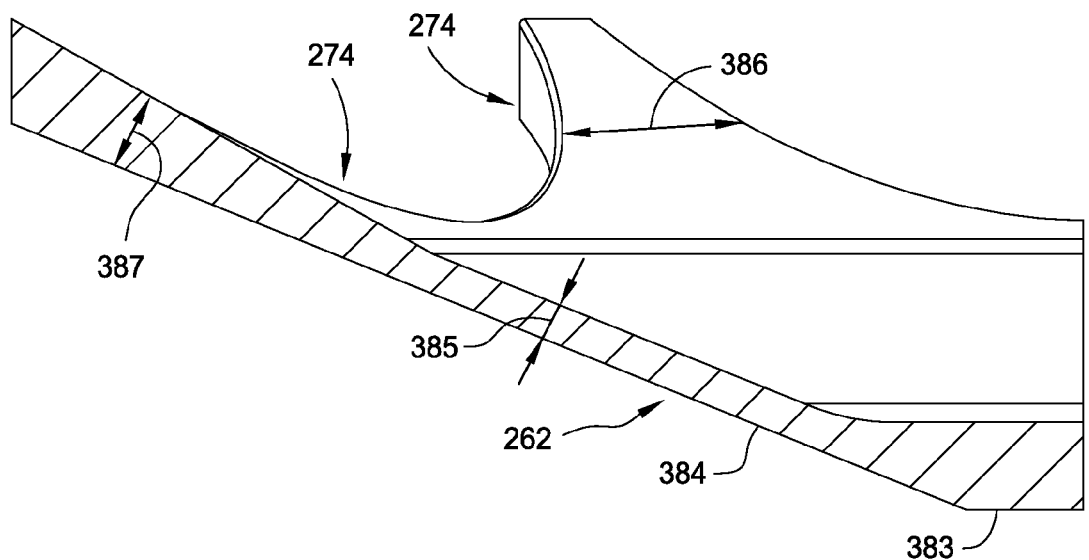
FIG. 3 illustrates a partial sectional view of a support body, according to one embodiment of the invention.

FIG. 3 illustrates a partial sectional view of a support body 264, according to one embodiment of the invention. The hub 262 includes an apex 383 having a first thickness. The apex 383 is adapted to couple with a shaft, such as the shaft 160 shown in FIG. 1. The hub 262 additionally includes a sidewall 384 having a thickness 385 less than the thickness of the apex 383. The relatively reduced thickness 385 reduces the thermal mass of the support body 264, thus facilitating more uniform heating during processing. The sidewall 384 allows the passage of a pyrometer focal beam 138 (shown in FIG. 1) therethrough. As the susceptor support shaft 127 rotates during the processing, the pyrometer focal beam 138 passes through the sidewall 384. Although the sidewall 384 is disposed within the path of a pyrometer focal beam, the path remains constant even as the support shaft 127 rotates. Therefore, the amount of pyrometer focal beam passing through the support shaft 127 to a susceptor is consistent. Thus, temperature measurement using the pyrometer focal beam 138 can be accurately determined through 360 degrees of rotation of the support shaft 127. In one example, the hub 262 may have a radius of about 60 millimeters or more to facilitate passage of a pyrometer focal beam therethrough. In such an embodiment, the pyrometer focal beam passes through the sidewall 384, which has a substantially constant thickness.

In contrast, prior known susceptor supports had arms which interrupted the pyrometer focal beam. Thus, the susceptor support rotated, the beam would experience areas of differing transmission path (e.g., either through a susceptor support arm, or adjacent thereto). The differing path of prior methods resulted in periods of inaccurate temperature measurement, because it is difficult to accurately calibrate a pyrometer for use through transmissions of different mediums. In contrast, the susceptor support shaft 127 facilitates a consistent path of the pyrometer focal beam transmission, and thus, the accuracy of temperature measurement using the pyrometer focal beam 138 is increased.

The support body 264 also includes a plurality of tapered bases 274 extending from the hub 262. As the width 386 of the tapered bases 274 decreases (e.g., as the tapered bases 274 extend outward from the hub 262), the height or thickness 387 of the tapered bases increases. The increase in the thickness 387 of the tapered base compensates for a reduced structural strength of the tapered base attributable to the decreasing width 386. Additionally, a similar bending moment of inertial is maintained. In one example, the thickness 385 is about 3 millimeters to about 5 millimeters, such as about 3.5 millimeters. The thickness 387 may be within a range of about 3 millimeters to about 12 millimeters. It is contemplated that the thicknesses 387 and 385 may be adjusted as desired.

Figure 4A:
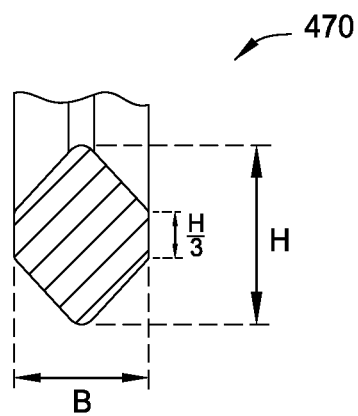
FIGS. 4A-4E illustrate sectional views of support arms, according to embodiments of the invention.

FIGS. 4A-4E illustrate sectional views of support arms, according to embodiments of the invention. FIG. 4A illustrates a cross sectional view of a support arm 270. The cross section is hexagonal. The relative dimensions of the support arm 270 maximize the moment of inertia of the support arm 270 while minimizing the area (and thus the mass) of the support arm 270. In one example, the base B may be about 8 millimeters, while the height H may be about 9.5 millimeters. It is to be noted that the connecting surface 278 of the support arm 270 has a rectangular cross section to facilitate coupling of the support arm 270 to a tapered base.

Figure 4B:
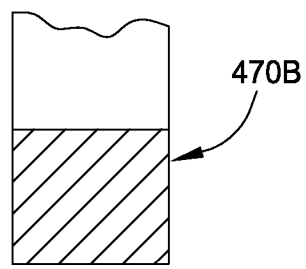
Figure 4C:
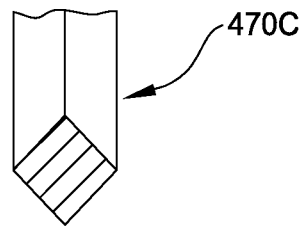
Figures 4D, 4E:
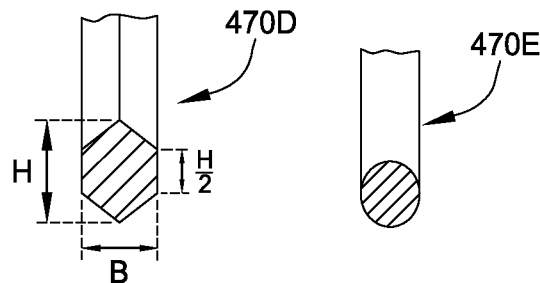

FIGS. 4B-4E illustrate additional sectional views of support arms, according to other embodiments. FIG. 4B illustrates a sectional view of a support arm 270B. The support arm 270B has a rectangular cross section. FIG. 4C illustrates a sectional view of a support arm 270C. The support arm 270C has a diamond-shaped cross section. FIG. 4D illustrates a sectional view of a support arm 270D. The support arm 270D has a hexagonal cross section of different relative dimensions than the cross section shown in FIG. 4A. FIG. 4E illustrates a sectional view of a support arm 270E. The support arm 270E has a circular cross section. Support arms having other shapes, including polygonal cross sections, are further contemplated.

Benefits of the invention generally include more accurate temperature measurement of susceptors and substrates during processing, particularly when using a rotating susceptor support shaft. The susceptor support shafts of the present invention facilitate consistent pyrometer beam transmission as the susceptor support shaft rotates. Thus, temperature measurement variations attributed to a change in transmission path of the pyrometer beam are reduced. Moreover, the reduced mass of the disclosed susceptor support improves substrate temperature uniformity and enhances process ramp up and ramp down times.

While the foregoing is directed to embodiments of the present invention, other and further embodiments of the invention may be devised without departing from the basic scope thereof, and the scope thereof is determined by the claims that follow.

We claim:

1. A susceptor support shaft for a process chamber, comprising:
   a cylindrical support shaft; and
   a support body coupled to the cylindrical support shaft, the support body comprising:
   a hub;
   a plurality of tapered bases extending from the hub;
   at least three support arms extending from some of the tapered bases, wherein each support arm is an angular arm comprising an elbow; and
   at least three dummy arms extending from some of the tapered bases,
wherein each dummy arm does not touch or otherwise support a susceptor.

2. The susceptor support shaft of claim 1, wherein the support arms are spaced at equal intervals from one another.

3. The susceptor support shaft of claim 1, wherein a thickness of each of the tapered bases increases as a width of each of the tapered bases decreases.

4. The susceptor support shaft of claim 1, wherein the at least three support arms and the at least three dummy arms are alternately located around the hub.

5. The susceptor support shaft of claim 1, wherein each of the support arms includes an opening therethrough for accepting a lift pin.

6. The susceptor support shaft of claim 1, wherein each of the support arms has a hexagonal cross section.

7. The susceptor support shaft of claim 1, wherein each of the support arms has a rectangular cross section.

8. The susceptor support shaft of claim 1, wherein each of the support arms has a round cross section.

9. The susceptor support shaft of claim 1, wherein the hub is conically shaped.

10. The susceptor support shaft of claim 1, wherein the at least three support arms include openings in a distal end thereof for accepting a pin therein.

11. The susceptor support shaft of claim 1, wherein the at least three support arms is four support arms.

12. The susceptor support shaft of claim 1, wherein the susceptor support shaft is formed from an optically transparent material.

13. The susceptor support shaft of claim 12, wherein the optically transparent material comprises quartz.

14. An optically transparent susceptor support shaft for a process chamber, comprising:
   a cylindrical support shaft; and
   a support body coupled to the cylindrical support shaft, the support body comprising:
      a conical hub;
      a plurality of tapered bases extending from the conical hub;
      at least three support arms extending from some of the tapered bases, the at least three support arms spaced at equal intervals from one another, wherein each support arm is an angular arm comprising an elbow; and
   at least three dummy arms extending from some of the tapered bases, the at least three dummy arms spaced at equal intervals from one another, wherein each dummy arm does not touch or otherwise support a susceptor.

15. The optically transparent susceptor support shaft of claim 14, wherein the optically transparent susceptor support shaft comprises quartz.

16. The optically transparent susceptor support shaft of claim 15, wherein the at least three support arms include openings in a distal end thereof for accepting a pin therein.

17. The optically transparent susceptor support shaft of claim 14, wherein the at least three support arms and the at least three dummy arms are alternately located around the conical hub.

18. The optically transparent susceptor support shaft of claim 16, wherein each of the support arms has a hexagonal cross section.

19. The optically transparent susceptor support shaft of claim 18, wherein a thickness of each of the tapered bases increases as a width of each of the tapered bases decreases.

20. The optically transparent susceptor support shaft of claim 16, wherein each of the support arms has a round cross section.

* * * * *